United States Patent
Miyata (10) Patent No.: US 9,375,872 B2
(45) Date of Patent: Jun. 28, 2016

(54) IMPRINT APPARATUS, MANUFACTURING METHOD FOR ARTICLE USING THE SAME, AND IMPRINT METHOD

(71) Applicant: CANON KABUSHIKI KAISHA, Tokyo (JP)

(72) Inventor: Naoki Miyata, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 749 days.

(21) Appl. No.: 13/683,095

(22) Filed: Nov. 21, 2012

(65) Prior Publication Data

US 2013/0134630 A1 May 30, 2013

(30) Foreign Application Priority Data

Nov. 28, 2011 (JP) ................................ 2011-258536
Nov. 20, 2012 (JP) ................................ 2012-253940

(51) Int. Cl.
*B29C 59/02* (2006.01)
*G03F 7/00* (2006.01)

(52) U.S. Cl.
CPC .............. *B29C 59/02* (2013.01); *G03F 7/0002* (2013.01)

(58) Field of Classification Search
CPC ..................................................... B29C 59/02
USPC ......................................................... 425/385
See application file for complete search history.

(56) References Cited

U.S. PATENT DOCUMENTS

| 4,737,824 | A | * | 4/1988 | Sakai et al. | ...................... 355/53 |
| 5,854,819 | A | * | 12/1998 | Hara et al. | ...................... 378/34 |
| 7,150,622 | B2 | | 12/2006 | Choi et al. | |
| 2010/0096774 | A1 | | 4/2010 | Kruijt-Stegeman et al. | |

FOREIGN PATENT DOCUMENTS

JP          2007-535121 A         11/2007

OTHER PUBLICATIONS

Korean Office Action dated May 21, 2015, issued in counterpart Korean Patent Application No. 10-2012-0135054, with an English translation.

* cited by examiner

*Primary Examiner* — Christina Johnson
*Assistant Examiner* — Xue Liu
(74) *Attorney, Agent, or Firm* — Fitzpatrick, Cella, Harper & Scinto (57) ABSTRACT

An imprint apparatus forms a pattern of an imprint material on a substrate with a mold. A holding unit holds the mold by attracting a first surface that is opposite to a second surface on which the pattern is formed, of the mold, with a suction unit. A suction force adjusting unit adjusts a suction force. A shape correcting unit applies a force to a lateral surface of the mold, such that a shape of a pattern region of the mold gets closer to a shape of a substrate-side pattern region of the substrate. The first mold surface includes first and second regions, the second region being closer to a center of the mold from the lateral surface than the first region. The suction force adjusting unit adjusts the suction force so that a suction force of the first region is lower than that of the second region.

7 Claims, 8 Drawing Sheets

IMPRINT APPARATUS, MANUFACTURING METHOD FOR ARTICLE USING THE SAME, AND IMPRINT METHOD

CLAIM OF PRIORITY

This application claims the benefit of Japanese Patent Application No. 2011-258536, filed Nov. 28, 2011, and Japanese Patent Application No. 2012-253940, filed on Nov. 20, 2012, which are hereby incorporated by reference herein in their entirety.

BACKGROUND OF THE INVENTION

1. Field of the Invention

The present invention relates to an imprint apparatus, a method of manufacture configured for an article using the same, and an imprint method.

2. Description of the Related Art

In addition to conventional lithography techniques, increasing demand for the miniaturization of semiconductor devices, MEMS, or the like, has focused attention on miniaturization processing techniques in which an uncured resin is formed using a die (mold) on a substrate and a resin pattern is formed on the substrate. These techniques are termed imprint techniques, and enable the formation on the substrate of a miniaturized structure on the order of several nanometers. Photocuring methods are one example of an imprint technique. An imprint apparatus that employs a photocuring method first coats an ultraviolet curable resin (e.g., an imprint material, or a photocurable resin) on a shot that is an imprint region on the substrate (for example, a wafer). Next, the resin (uncured resin) is formed using a mold. A resin pattern is formed on the substrate by release after irradiation with UV radiation to cure the resin. Since the imprint technique according to this type of photocuring method can control the temperature in a relatively simple manner and enable detection of an alignment mark formed on the substrate through a transparent mold, it is particularly adapted to the manufacture of a semiconductor device.

When executing an imprint process with the imprint apparatus employing the above technique, an alignment process of the mold and the substrate is performed in the same manner as a general exposure apparatus, or the like, and the shape of the pattern portion formed on the mold and the pattern on the substrate side that is pre-formed on the shot are aligned. A method of alignment processing includes, for example, die-by-die alignment or global alignment. A method of die-by-die alignment performs optical detection of a mark formed on a shot for each shot on a substrate and then performs a correction for a deviation in the positional relationship between the original plate (mold or reticle in an exposure device) and the substrate. On the other hand, a global alignment method uses the fact that the positional relationship between the apparatus and the substrate, or the apparatus and the original plate is clear, and corrects a deviation based on an index that is obtained by performing statistical processing of the detection results in relation to a mark formed on a number of representative shots (sample shots). In other words, the global alignment method executes the alignment process using the same index with respect to all shots. In a conventional exposure apparatus, the global alignment method is generally used from the point of view of improving throughput.

In this context, a conventional exposure apparatus corrects a deviation due to a change in the shape of each shot during an exposure process by changing the reduction magnification of the projection optical system in accordance with the shape (magnification) of the shot, or by changing the scanning speed of the substrate stage. However, an imprint apparatus does not include a projection optical system and cannot execute this type of shot correction (magnification correction) due to direct contact between the resin on the substrate and the mold. Therefore, the imprint apparatus employs a magnification correcting mechanism that holds the mold with a holding unit (chuck) operating due to mechanical fixture or vacuum suction, or the like, and executes expansion by application of an external force from the side face of the mold or by heating the mold to thereby physically deform the mold. Japanese Patent Laid-Open No. 2007-535121 discloses an imprint system that is configured to deform a mold by application of an external force by use of an actuator, or the like, to thereby deform the shape of a pattern portion relative to the pattern on the substrate side.

However, since the conventional imprint apparatus executes constant fixed retention of the mold using the holding unit, as described above, even when an external force is applied to the mold, as described in Japanese Patent Laid-Open No. 2007-535121, in order to deform the shape of the pattern portion, the mold resists deformation. In this regard, when an external force is applied after simply temporarily removing the fixed retention of the mold in order to improve the deformation efficiency, the retention position itself of the mold undergoes a change. Therefore, when employing a global alignment method as the method for alignment processing, the value measured in relation to alignment processing can no longer be used for reference due to the fact that the mold has deviated after execution of the alignment processing.

SUMMARY OF THE INVENTION

The present invention is proposed in light of the circumstances described above and has the object of providing an imprint apparatus that is useful for efficient alignment processing or shape correction of a mold.

The configuration of the present invention is an imprint apparatus configured to form, and to cure, uncured resin with a mold on a substrate, and to form a pattern on the cured resin on the substrate and includes a holding unit configured to hold the mold by use of a suction unit including a plurality of suction force generating portions, a suction force adjusting unit configured to enable adjustment of a suction force by the plurality of suction force generating portions, and a shape correcting unit configured to align a shape of a pattern region of the mold with a shape of a substrate-side pattern region of the substrate by applying force to the mold, wherein, in the case of applying a force to the mold by use of the shape correcting unit, the suction force adjusting unit configures a predetermined region of a suction surface applying suction to the mold as a suction region, and adjusts the suction force of the plurality of suction force generating portions, so that the suction force on the other region is less than the suction force on the suction region.

The present invention enables the provision of an imprint apparatus that is useful in relation to efficiency of the alignment processing or the shape correction of a mold.

Further features of the present invention will become apparent from the following description of exemplary embodiments with reference to the attached drawings.

DESCRIPTION OF THE EMBODIMENTS

The aspects for execution of the present invention will be described below making reference to the figures.

(Imprint Apparatus)

Figure 1:
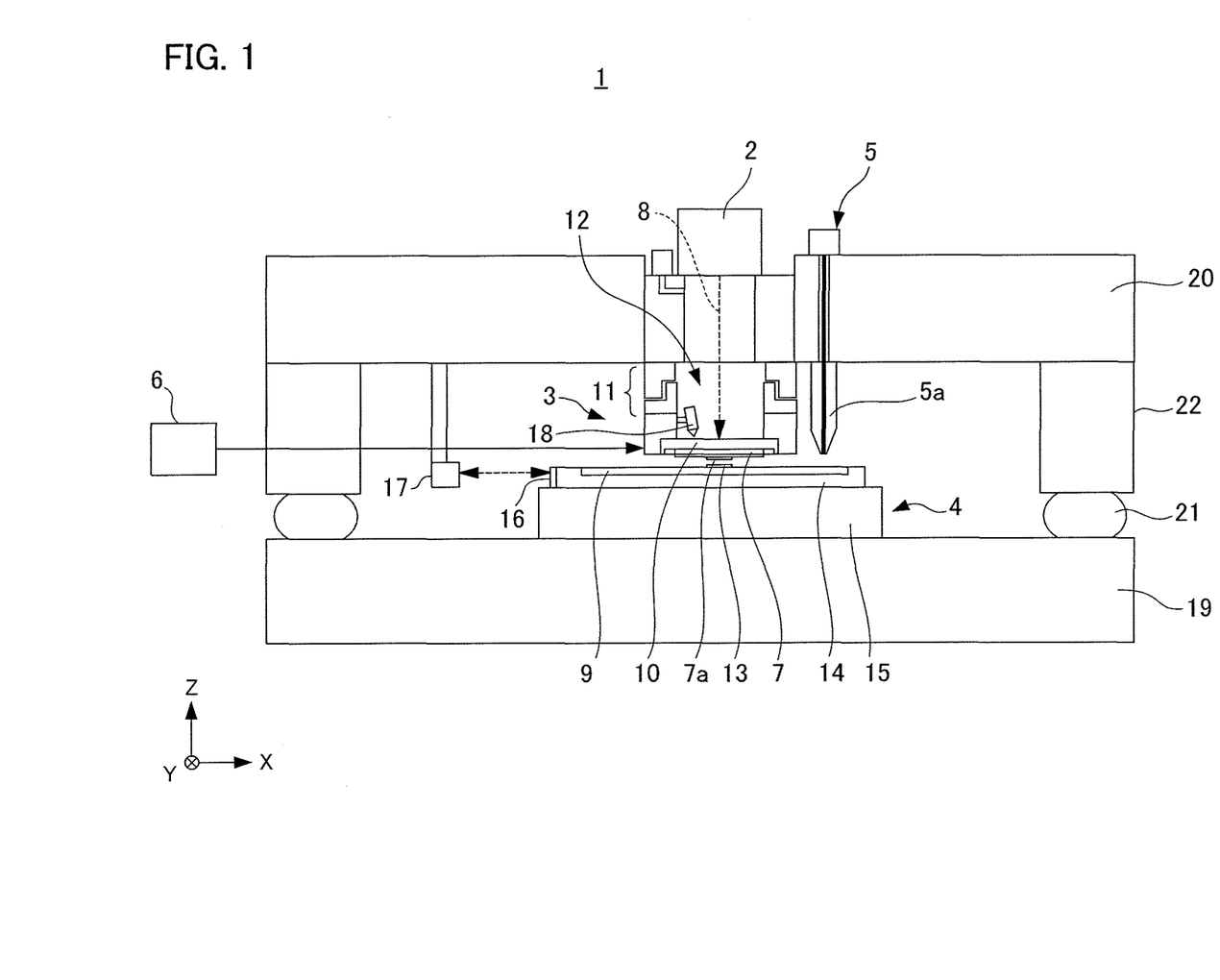
FIG. 1 illustrates the configuration of an imprint apparatus according to a first embodiment of the present invention.

First, the imprint apparatus according to the first embodiment of the present invention will be described. FIG. 1 is a schematic diagram that illustrates the configuration of an imprint apparatus 1 according to the present embodiment. The imprint apparatus 1 is an apparatus that is used in the manufacture of a device, such as a semiconductor device as an example of an article, by forming an uncured resin on a wafer (on a substrate) that is the processed substrate, using a mold, to thereby form a resin pattern on the wafer. In this context, the apparatus is an imprint apparatus that employs a photo-curing method. In the following figures, a Z axis is provided in parallel to the optical axis of an illumination system configured to irradiate UV light on a resin provided on a wafer, and an X axis and a Y axis are provided in a mutually orthogonal orientation in a plane that is vertical to the Z axis. The imprint apparatus 1 basically includes a light irradiation unit 2, a mold holding mechanism 3, a wafer stage 4, a coating unit 5, and a control unit 6.

The light irradiation unit 2 irradiates UV light 8 onto the mold 7 during imprint processing. Although the light irradiation unit 2 is not illustrated, it is configured from a light source and an optical element configured to suitably adjust the UV light 8 irradiated from the light source to a light suitable for imprinting.

The outer peripheral shape of the mold 7 is polygonal (preferably, rectangular or square), and the central portion of the surface facing the wafer 9 includes a pattern portion 7a (pattern region) that is formed with a three-dimensional uneven pattern for transcription of a circuit pattern, or the like. The material of the mold 7 is a material that enables transmission of UV light 8, and, in the present embodiment, may be exemplified by quartz. Furthermore, the shape of the mold 7 may be configured with an indentation (cavity) having a certain depth and a circular planar shape on the surface irradiated with UV light 8.

Figure 2:
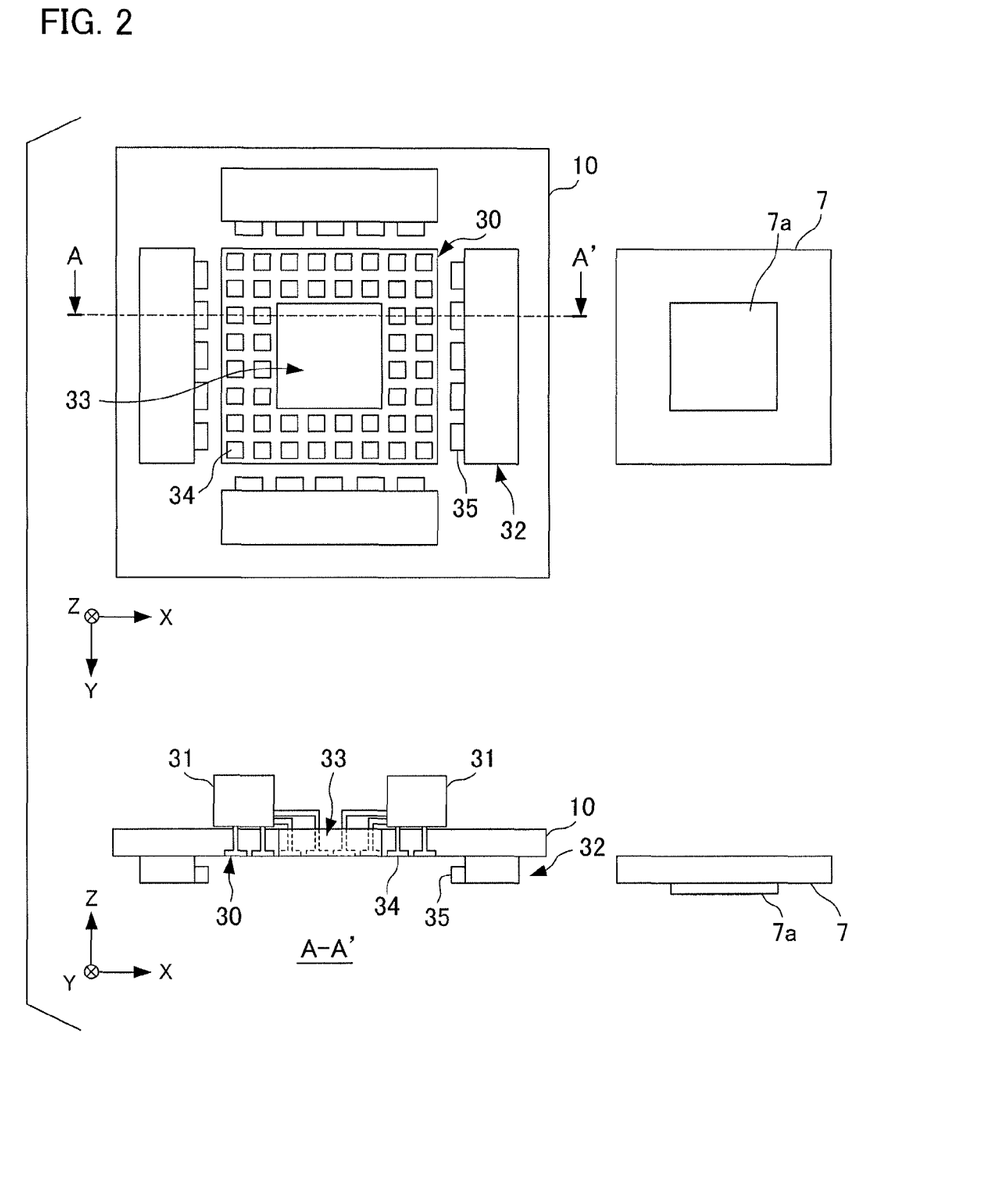
FIG. 2 illustrates another configuration for a mold chuck.

The mold holding mechanism (mold holding mechanism) 3 includes a mold chuck (holding unit) 10 configured to hold the mold 7 and a mold driving mechanism 11 configured to hold the mold chuck 10, and to displace the mold 7 (mold chuck 10) in a predetermined direction. FIG. 2 is a schematic diagram that illustrates another configuration for the mold chuck 10. In particular, the upper portion of the figure in FIG. 2 is a plan figure of the mold chuck 10 seen from the orientation of the wafer stage 4, and the lower portion of the figure is a sectional view along A-A' of the upper portion. The mold chuck 10 holds the mold 7 by suctioning the outer peripheral region of the irradiation surface for UV light 8 in the mold 7, by use of a vacuum suction force. Note that, in FIG. 2, the mold chuck 10 is in a state in which the mold chuck 10 does not hold the mold 7, and for the purposes of reference, the mold 7 that can be held by the mold chuck 10 is illustrated next to the mold chuck 10. The mold chuck 10 includes a suction unit 30 configured to hold the mold 7 by suction, a pressure adjusting apparatus 31 configured to adjust the suction pressure applied by the suction unit 30, and a magnification correcting mechanism 32 configured to apply an external force in relation to the side surface of the mold 7, when the mold 7 is held by the suction unit 30. Furthermore, the mold chuck 10 includes an open portion 33 in the central region (planar inner side), so that the UV light 8 irradiated from the light irradiation unit 2 passes through the mold 7 towards the wafer 9. The open shape of the open portion 33 corresponds to the planar shape of the pattern portion 7a formed on the mold 7, and an open region 12 corresponding to the open portion 33 is also formed in the same manner on the mold drive mechanism 11 described below that fixes and holds the mold chuck 10.

As illustrated in FIG. 2, the suction units 30 are respectively connected to the pressure adjusting apparatus 31 and include a plurality of aspiration ports 34 configured to enable separate adjustment of the suction pressure. In the example illustrated in FIG. 2, the shape of these aspiration ports 34 are rectangular, and forty-eight holes are provided corresponding to the region on the periphery of the open portions 33 in the planar region of the mold 7, and are aligned along the XY axial direction. The shape and the disposition (number) of the aspiration ports 34 is adapted to facilitate deformation of the mold 7 in a direction in which the external force is applied by the magnification correcting mechanism 32, as described below. Therefore, the shape and the disposition of the aspiration ports 34 is not limited to the configuration illustrated in FIG. 2 and, for example, may be configured as illustrated in FIG. 3.

Figure 3:
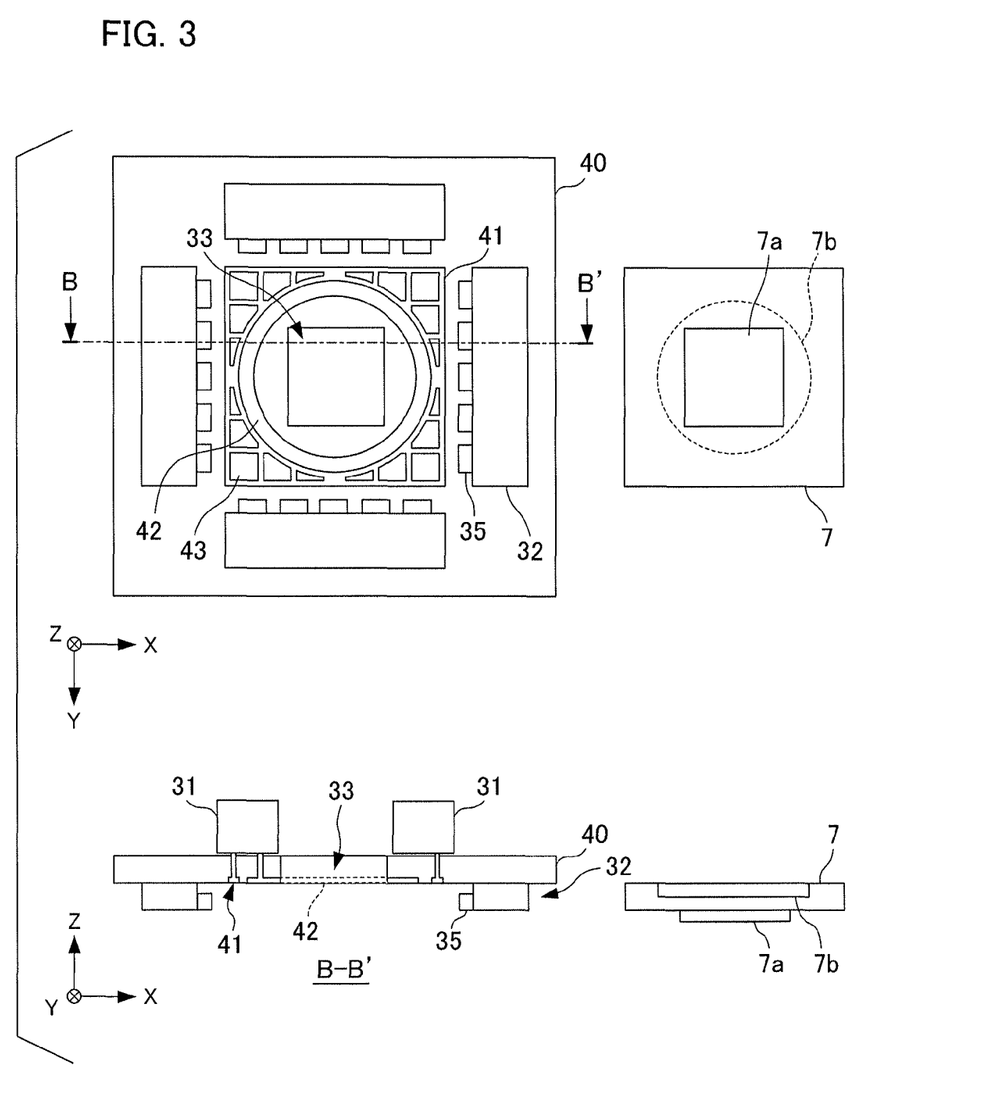
FIG. 3 illustrates another configuration for a mold chuck.

FIG. 3 is a schematic figure illustrating a configuration including another example of a suction unit 30 adapted to the mold chuck 10 illustrated in FIG. 2. In particular, the upper portion of the figure in FIG. 3 is a plan view of the mold chuck 40 seen from the wafer stage 4, and the lower portion is a figure illustrating the section B-B' in the upper portion. In FIG. 3, the same elements of configuration in FIG. 2 are denoted by the same reference numerals, and a description will not be repeated. As described above, the mold 7 may include an indentation (indentation 7b in the figure) facing the pattern portion 7a. In the example illustrated in FIG. 3, the suction unit 41 includes a circular first aspiration port 42 disposed in an outer peripheral region and a plurality of second aspiration ports 43 disposed on an outer peripheral side of the first aspiration port 42, in order to avoid the indentation 7b. The shape and the disposition of the second aspiration ports 43 are determined based on the interval (distance) between the outer side of the suction unit 41 corresponding to the planar region of the mold 7 and the outer periphery of the first aspiration port 42. The suction unit 41 exhibits the advantage that the indentation can be avoided while holding and enabling comparatively stable retention of a proximate region by a pattern portion 7a that is required for enhancing the close attachment relative to the amount of deformation.

The pressure adjusting apparatus (suction force adjusting portion) 31 includes a vacuum exhaust apparatus, such as a vacuum pump, or the like, and, as described above, enables separate adjustment or switching of the suction pressure (suction force) in the plurality of aspiration ports (suction force generating portion) 34 provided in the suction unit 30, or with respect to a plurality of groups thereof. The pressure adjusting apparatus 31 is connected with the control unit 6 through a line, and the suction pressure of the respective plurality of aspiration ports 34 is adjusted based on a suction command from the control unit 6.

In addition, the magnification correcting mechanism (shape correcting unit) 32 is disposed on the held side of the mold 7 in the mold chuck 10, and corrects the shape (or the size) of the pattern portion 7a by application of an external force (displacement) to the side face of the mold 7. The magnification correcting mechanism 32 includes a plurality of actuators 35 that apply an external force by causing contact of the side face of the mold 7 with the pressure surface and an actuator control unit (not illustrated) that performs separate adjustment of the load amount of the external force by the actuators 35. The actuator control unit is connected to the control unit 6 though a line, and the respective load amounts of the plurality of actuators 35 is adjusted based on the load command from the control unit 6. Four magnification correcting mechanisms 32 are disposed so that the pressure surface of the actuator 35 faces the side of the suction unit 30 in order to apply respective external forces to the four side faces of the mold 7 that is held by suction. In the example illustrated in FIG. 2, one magnification correcting mechanism 32 is configured to include five actuators 35 disposed equidistantly with respect to the length of the side face of the mold 7. However, although this plurality of actuators 35 is preferably disposed equidistantly, there is no particular limit on the number thereof. Furthermore, although the magnification correcting mechanism 32 is configured by direct disposition on the mold chuck 10 in the example illustrated in FIG. 2, there is no limitation in this regard, and, for example, a configuration is possible in which the mechanism 32 extends from the side provided with the mold driving mechanism 11 that fixes and holds the mold chuck 10 toward the side face of the mold 7.

The mold driving mechanism 11 displaces the mold 7 in the respective axial orientations to selectively press or to separate the mold 7 and the resin 13 on the wafer 9. A linear motor and an air cylinder are examples of an actuator that can be employed in the mold driving mechanism 11. Furthermore, a configuration using a plurality of driving systems, such as a coarse driving system and a fine driving system, may be employed in order to adapt to the highly accurate positional determination of the mold 7. Furthermore, in addition to the Z axis direction, a configuration is possible that has a function for positional adjustment in the X axis direction or the Y axis direction, or the theta (rotation about the Z axis) direction, or a tilt function for correction of inclination of the mold 7. Although the pressing or separation operation in the imprint apparatus 1 may be executed by displacing the mold 7 in the Z axis direction, execution is also possible by displacing the wafer stage 4 in the Z axis direction or by relative displacement of both components.

The wafer 9 is a monocrystalline silicon substrate or an SOI (silicon on insulator) substrate, and the surface for processing is coated with a resin 13 that is a UV curable resin and is formed by the pattern portion 7a formed on the mold 7.

The wafer stage 4 holds the wafer 9 and, during pressing of the mold 7 and the resin 3 on the wafer 9, executes positional determination of the shape of the region (substrate-side pattern region) that pre-forms a substrate-side pattern on the surface to be processed of the wafer 9 and the shape of the pattern portion on the mold 7. The wafer stage 4 includes a wafer chuck 14 that holds the wafer 9 with a suction force and a stage driving mechanism 15 that holds the wafer chuck 14 with a mechanical means, and that enables displacement in respective axial directions. A linear motor and a planar motor are examples of an actuator that can be employed in the stage driving mechanism 15. Furthermore, a configuration using a plurality of driving systems, such as a coarse driving system and a fine driving system, with respect to the respective X axis and Y axis directions may be employed in the stage driving mechanism 15. Furthermore, a configuration is possible that has a driving system for positional adjustment in the Z axis direction, a function for positional adjustment in the theta direction of the wafer 9, or a tilt function for correction of inclination of the wafer 9. The wafer stage 4 includes a plurality of reference mirrors 16 corresponding to the directions X, Y, Z, $\omega x$, $\omega y$, and $\omega z$, on the side face. In this regard, the imprint apparatus 1 includes a plurality of laser interferometers (measuring machines) 17 configured to measure the position of the wafer stage 4 by irradiating respective beams onto the reference mirrors 16. The laser interferometers 17 measure the position of the wafer stage 4 in real time, and the control unit 6, as described below, executes positional determination control of the wafer 9 (wafer stage 4) based on the measurement value at that time.

The coating unit 5 is disposed in proximity to the mold holding mechanism 3 to thereby coat resin (uncured resin) 13 onto the wafer 9. The resin 13 is a photocurable resin (imprint material) that exhibits a property of curing by application of UV light 8, and is suitably selected in response to various types of conditions, such as semiconductor device manufacture processes, and the like. Furthermore, the amount of resin 13 that is extruded from an ejection nozzle 5a in the coating unit 5 is suitably determined in response to the desired thickness of the resin formed on the wafer 9, or the density of the formed pattern.

The control unit 6 controls the operation and the adjustment of each constituent element of the imprint apparatus 1. The control unit 6, for example, may be configured by a computer, or the like, and is connected through a line with the constituent elements of the imprint apparatus 1 to thereby execute control of each constituent element in accordance with a program, or the like. The control unit 6 according to the present embodiment at least controls the operation of the suction unit 30 and the magnification correcting mechanism 32 included in the mold holding mechanism 3. The control unit 6 may be integrally configured (in a common housing) with other components of the imprint apparatus 1, or may be configured as a separate component (in a separate housing) to the other components of the imprint apparatus 1.

The imprint apparatus 1 includes an alignment measuring system 18 that is a measuring unit configured to execute measurement, and the like, of the shape of the substrate-side pattern region being the portion to be processed that is present on the wafer 9 during imprint processing. The alignment measuring system 18 is, for example, disposed in the open region 12 as illustrated in FIG. 1. In this manner, the alignment measuring system 18 enables detection of an alignment mark formed on the wafer 9 through the mold 7. The imprint apparatus 1 includes a base support member 19 configured to mount the wafer stage 4, a bridge support member 20 configured to fix the mold holding mechanism 3, and a support 22 configured to extend from the base surface plate 19 and configured to support the bridge surface plate 20 through a damping device 21. Of the above components, the damping device 21 removes a vibration that is transmitted from the floor surface to the bridge surface plate 20. Furthermore, although not illustrated in the figure, the imprint apparatus 1 includes a mold conveying mechanism configured to convey the mold 7 from an external location of the apparatus to the mold holding mechanism 3 and a substrate conveying mechanism configured to convey the wafer 9 from an external location of the apparatus to the wafer stage 4.

Figure 4:
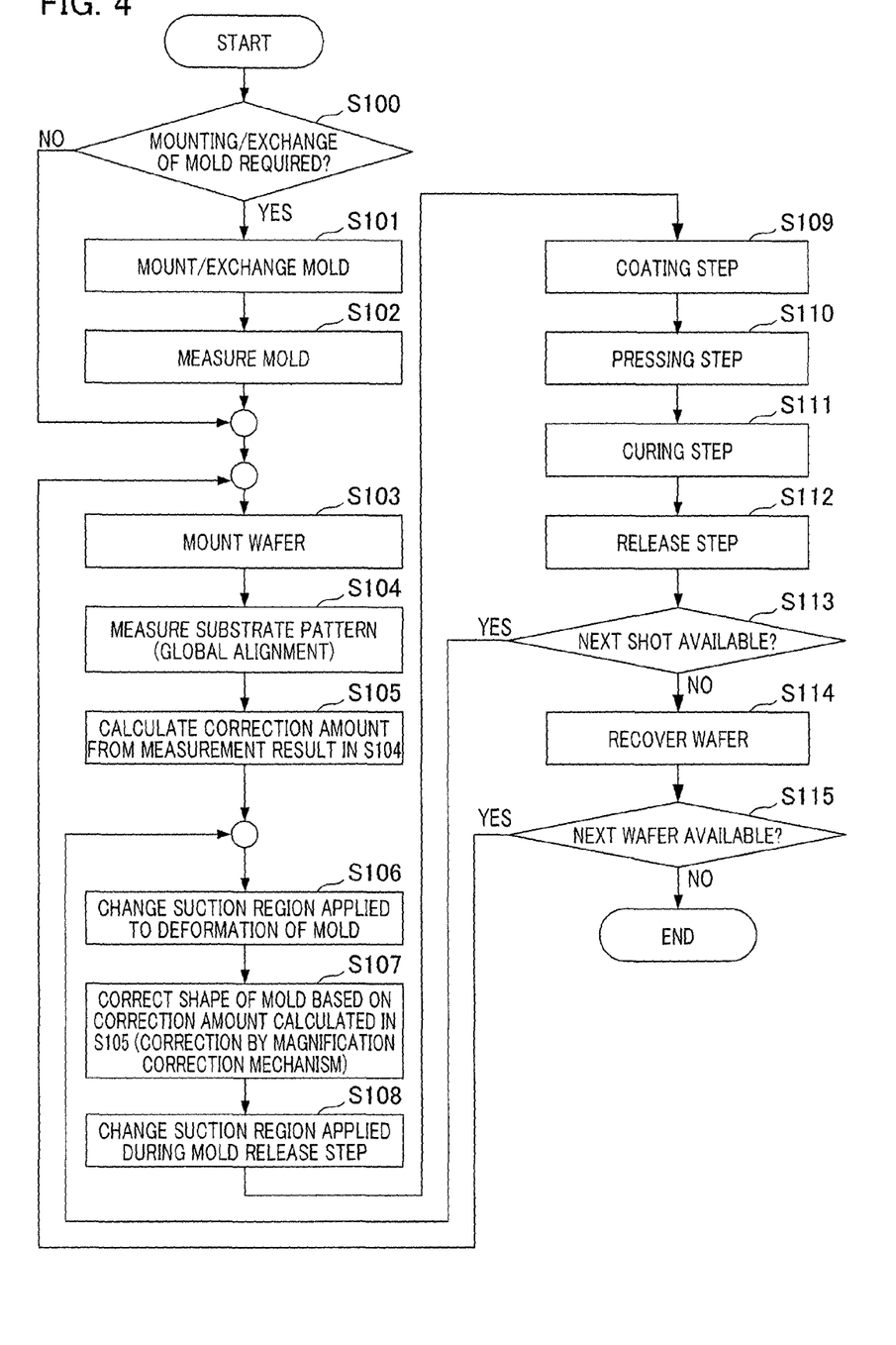
FIG. 4 is a flowchart illustrating the operational sequence during imprint processing.

Next, the imprint process performed by the imprint apparatus 1 will be described. FIG. 4 is a flowchart illustrating the operational sequence during imprint processing when using the same mold 7 in relation to a plurality of wafers 9 in the imprint apparatus 1 and using the plurality of substrate-side pattern regions that are present on the wafer 9 as a pattern forming region (shot). First, when the operation sequence commences, the control unit 6 determines whether or not the mold 7 is mounted on the mold chuck 10 or whether it is necessary to exchange the articles already mounted (step S100). Herein, the control unit 6 executes mounting or exchange of the mold 7 by use of the mold conveying mechanism when it is determined that the mold is not mounted or that the mold must be exchanged (YES) (step S101). On the other hand, when it is determined in step S100 that the mold is mounted or that exchange of the mold is not necessary (NO), the processing proceeds to step S103. Next, the control unit 6 measures the shape of the pattern portion 7a formed on the mold 7 by consulting the reference mark on the wafer stage 4 by use of the alignment measuring system 18 (step S102). Then, the control unit 6 mounts the wafer 9 that is the substrate to be processed currently on the wafer chuck 14, by use of the substrate conveying mechanism (step S103). The control unit 6 extracts a number of the plurality of substrate-side pattern regions present on the wafer 9 in order to execute global alignment, to thereby measure the shape of the extracted substrate-side pattern region with the alignment measuring system 18 (step S104). Thereafter, the control unit 6 refers to the shape of the pattern portion 7a acquired in the step S102 and the measurement results of the substrate-side pattern region acquired in the step S104, to thereby calculate the correction amount (deviation amount) for the shape of the pattern portion 7a corresponding, respectively, to the substrate-side pattern regions. Then, the control unit 6 uses the magnification correcting mechanism 32 to deform the shape of the mold 7 (pattern portion 7a) and to thereby correct the deviation in relation to the substrate-side pattern region that is the object of pattern formation, on this occasion. The operation during deformation of the mold 7 according to the present embodiment will be described below.

Figure 8A:
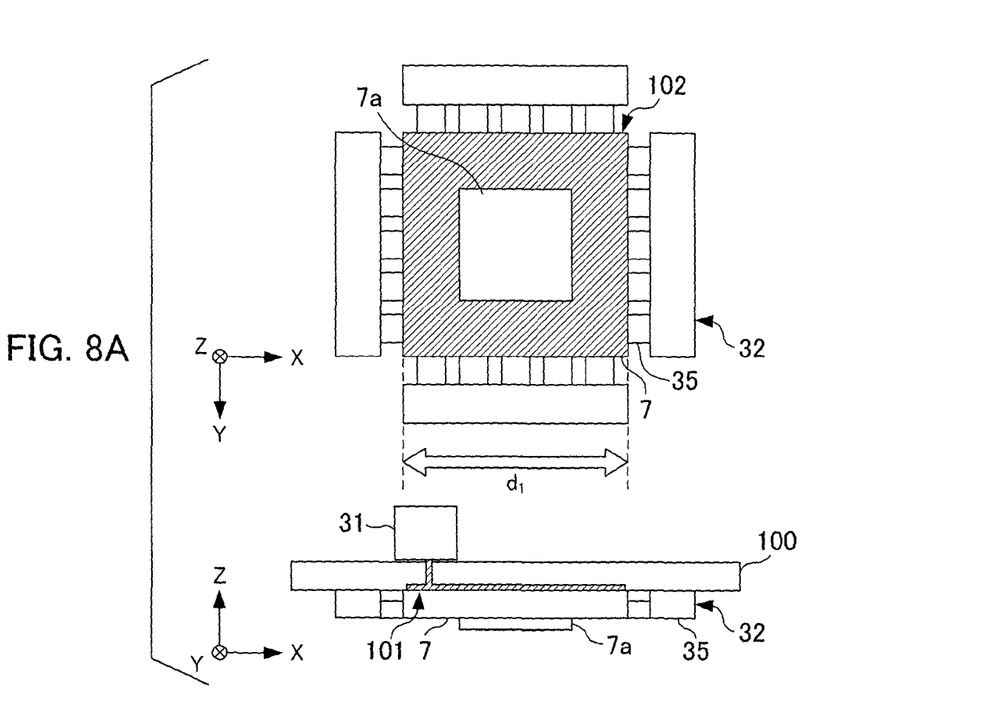
FIGS. 8A and 8B illustrate a configuration during magnification correction of a conventional mold.
Figure 8B:
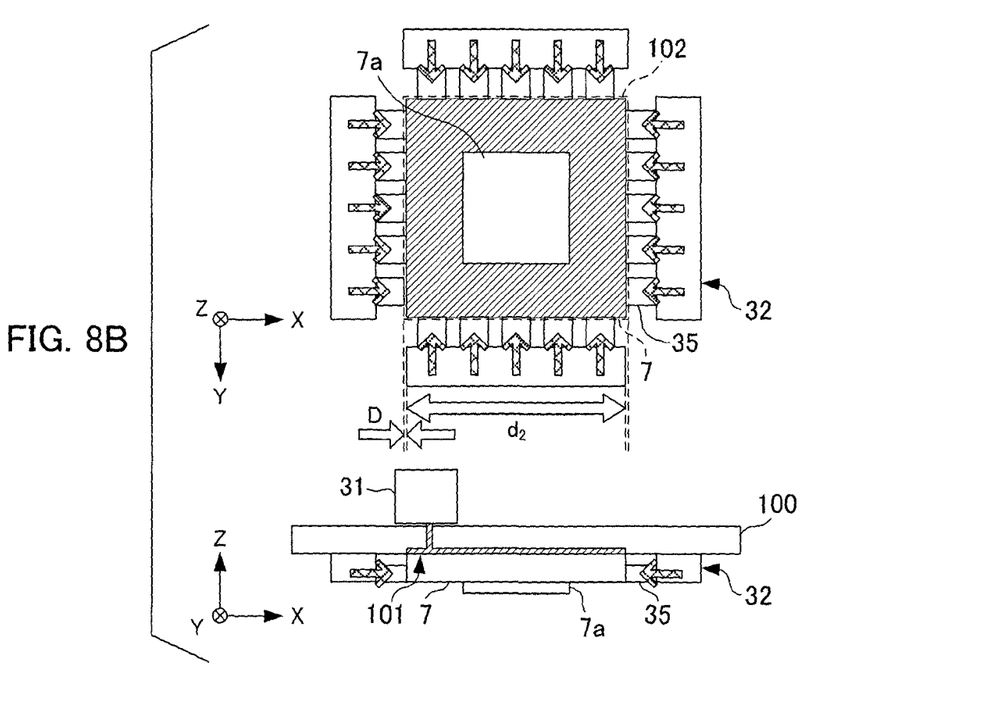

First, for the purposes of reference, magnification correction (shape correction) will be described in relation to a mold that uses a magnification correcting mechanism in a conventional imprint apparatus. For the purpose of simplifying the description, the configuration of a conventional mode chuck 100, as illustrated in FIGS. 8A and 8B corresponds to the mold chuck according to the present embodiment, as illustrated in FIG. 2. In particular, the pressure adjusting apparatus and the magnification correcting mechanism in the mold chuck 100 have the same configuration as that described in the present embodiment, the shape of the mold is the same, and the same features are denoted using the same reference numerals and, therefore, a description will not be repeated.

FIG. 8A illustrates the state before the application of an external force using the magnification correcting mechanism 32 in relation to a mold 7 that is held by suction on the mold chuck 100, and FIG. 8B illustrates the state of deformation of the mold 7 after application of an external force using the magnification correcting mechanism 32. As illustrated in FIG. 8A and FIG. 8B, the suction unit 101 in a conventional mold chuck 100 holds a mold 7 by suction using one aspiration port (aspiration region 102) connected with the pressure adjusting apparatus 31 through one discharge pipe. Furthermore, even when the aspiration port is configured with a plurality of minute aspiration holes, the suction pressure is not respectively adjusted by the suction region 102. Therefore, even when an external force is applied by the magnification correcting mechanism 32 to the mold 7, since a strong and fixed suction force on the mold 7 is exerted by the suction unit 101, the mold 7 is resistant to deformation. For example, when the length of one side before deformation of the mold 7 is denoted as $d_1$, and the length after deformation is denoted as $d_2$, as illustrated in FIG. 8B, the deformation amount of one side D ($=(d_1-d_2)/2$) takes a small value.

Figure 5A:
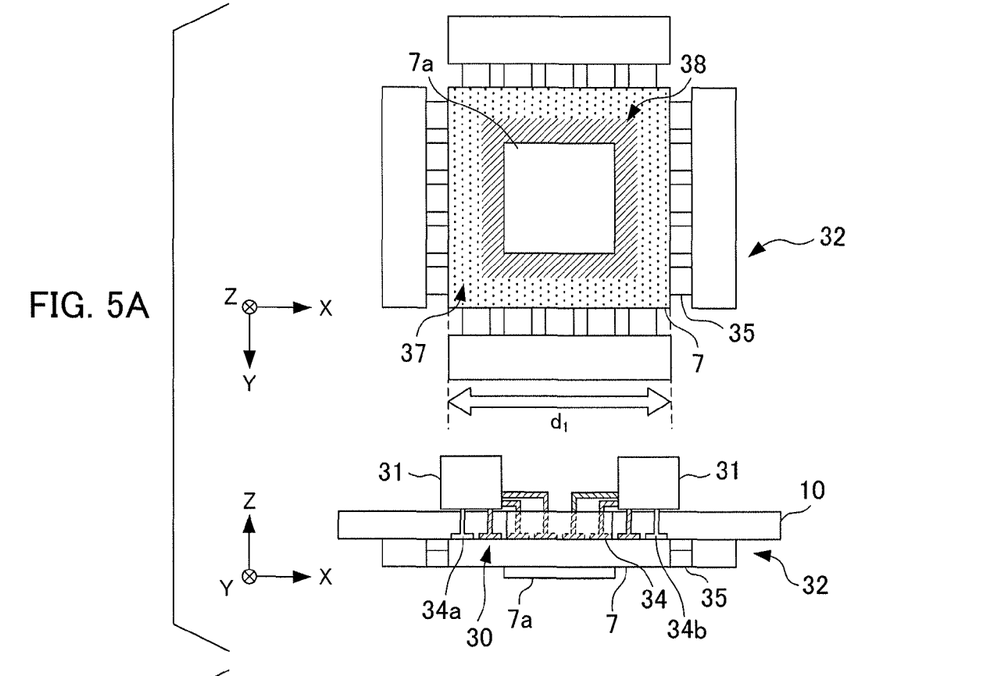
FIGS. 5A and 5B illustrate the configuration during magnification correction of the mold.
Figure 5B:
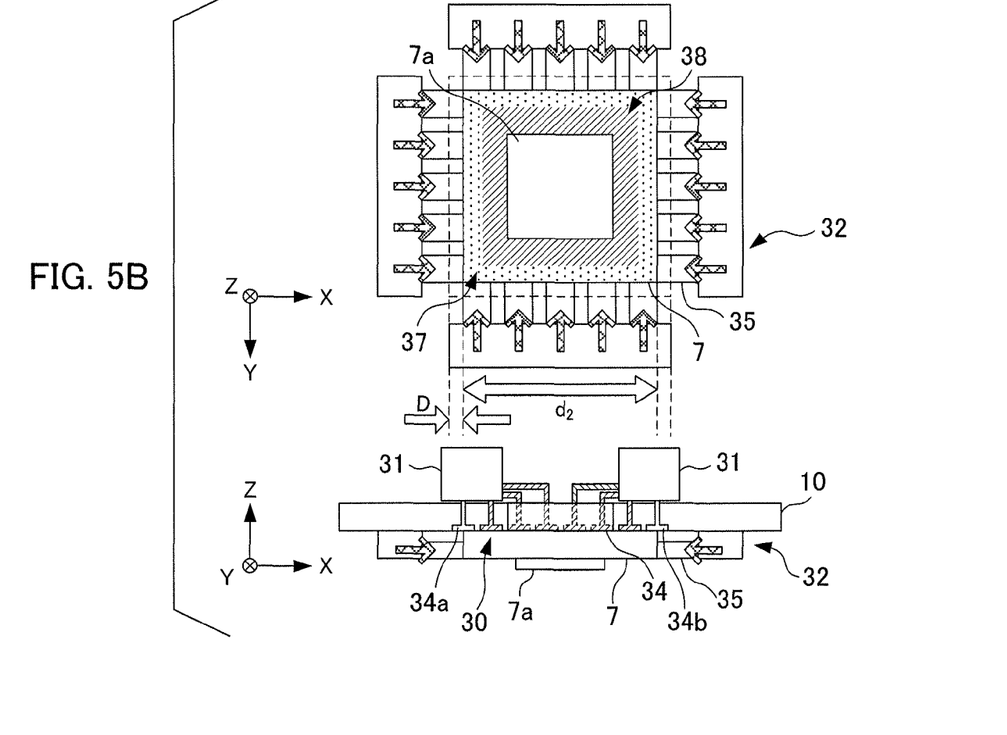

In this regard, FIGS. 5A and 5B are schematic figures that describe the configuration during magnification correction of the mold 7 in the imprint apparatus 1 according to the present embodiment. FIGS. 5A and 5B adopt a configuration of the mold chuck 10 of the present embodiment, as illustrated in FIG. 2, and correspond to FIGS. 8A and 8B when using a conventional imprint apparatus. First, in the interval from the commencement of imprint processing until step S105 in FIG. 4, the mold 7 is subjected to a fixed suction pressure by all aspiration ports 34 in the suction unit 30 of the mold chuck 10. That is to say, the suction surface of the mold 7 is held as a suction region. Then, the control unit 6 changes the suction region on the suction surface of the mold 7 by respectively adjusting the suction pressure exerted by the plurality of aspiration ports 34 through the pressure adjusting apparatus 31 before the application of an external force to the mold 7 by the magnification correcting mechanism 32 (step S106). The variation of the suction region, for example, as illustrated in FIG. 5A, is performed by configuring an end-side region (external peripheral region) from the end of the side face on the suction surface of the mold 7 as a non-suction region 37 and configuring the region on the inner side of the region 37 as a suction region 38. In this configuration, the pressure adjusting apparatus 31 enables setting of the non-suction region 37 by returning the suction pressure of the total of 28 aspiration ports 34a, 34b of the plurality of aspiration ports 34 that are positioned on the outermost periphery on the suction surface to atmospheric pressure. Next, as illustrated in FIG. 5B, the control unit 6 uses the magnification correcting mechanism 32 to vary the shape of the pattern portion 7a by application of an external force to the mold 7 with reference to a correction amount calculated in step S105, to thereby correct a deviation relative to the substrate-side pattern region (step S107). Since the mold 7 at this time exhibits a tendency to deform due to the presence of the non-suction region 37 (applied to deformation of mold 7), the magnification correcting mechanism 32 can perform an efficient deformation operation on the suction surface of mold 7 to a desired shape. For example, when the state in FIG. 5B is compared with the conventional configuration illustrated in FIG. 8B, if the mold 7 is deformed in accordance with the present embodiment, the central position of the pattern portion 7a is fixed and the deformation amount of one side D ($=(d_1-d_2)/2$) can be increased. After completion of the shape correction of the mold 7, the control unit 6 executes a further change of the suction region so that the suction pressure of the aspiration ports 34 in the non-suction region 37 becomes equal to the suction region 38 for application during subsequent mold release steps in relation to the pressure adjusting apparatus 31 (step S108). In this manner, the mold 7 after shape correction is held by a suction surface, which is the whole surface of the suction unit 30 of the mold chuck 10.

Figure 6A:
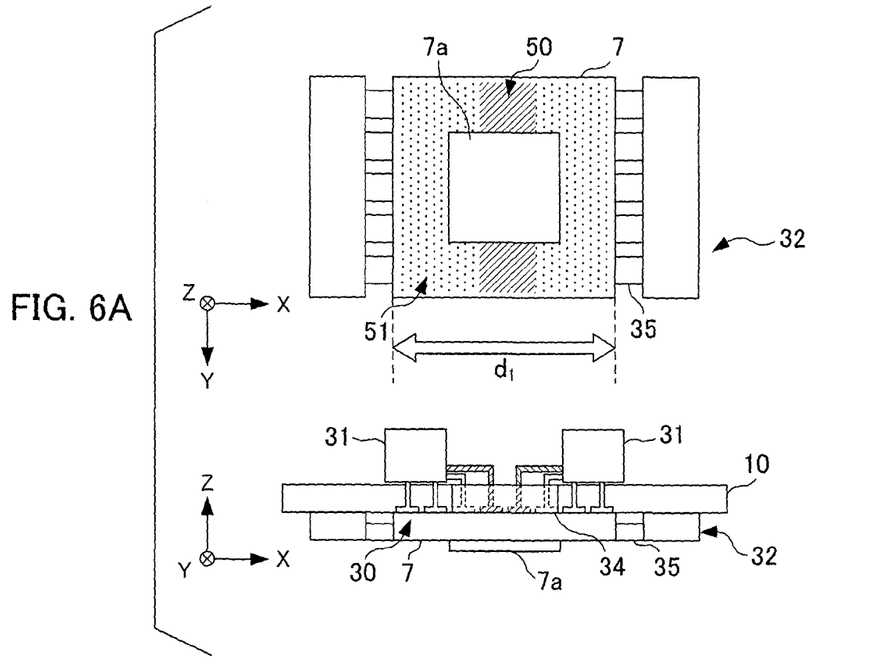
FIGS. 6A and 6B illustrate another configuration during magnification correction of the mold.
Figure 6B:
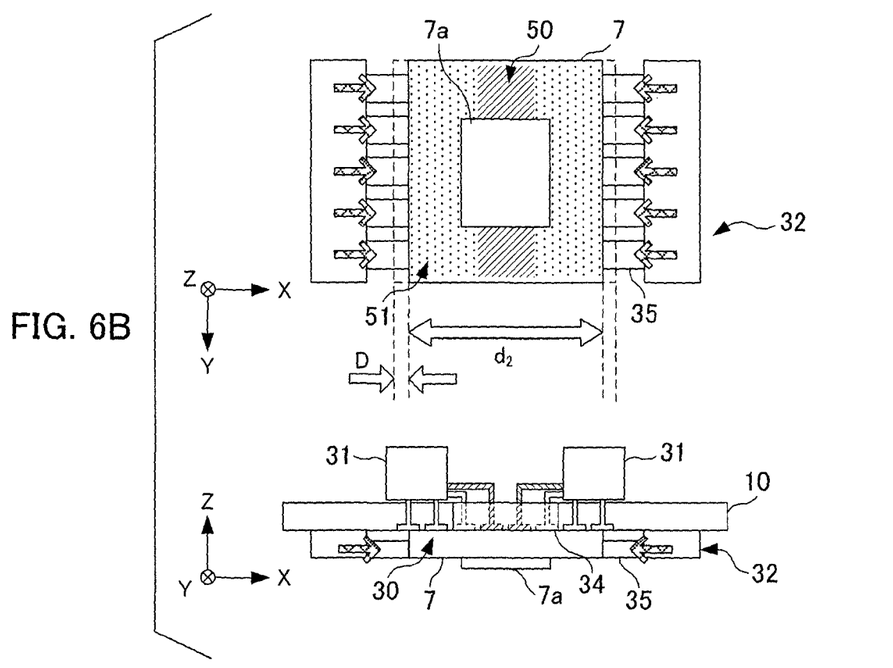
Figure 7A:
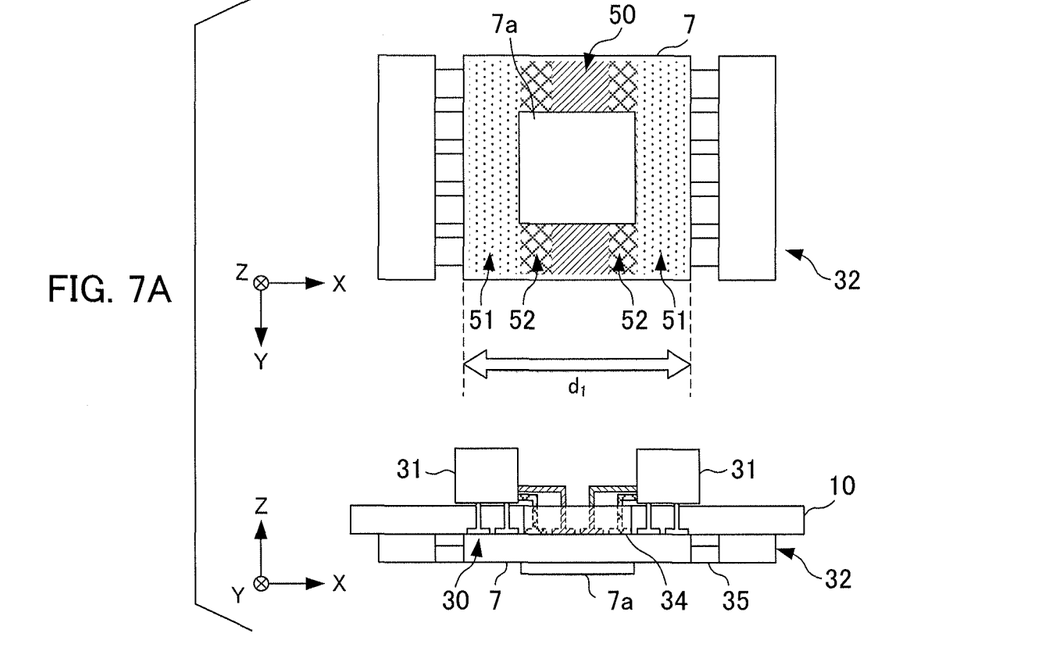
FIGS. 7A and 7B illustrate another configuration during magnification correction of the mold.
Figure 7B:
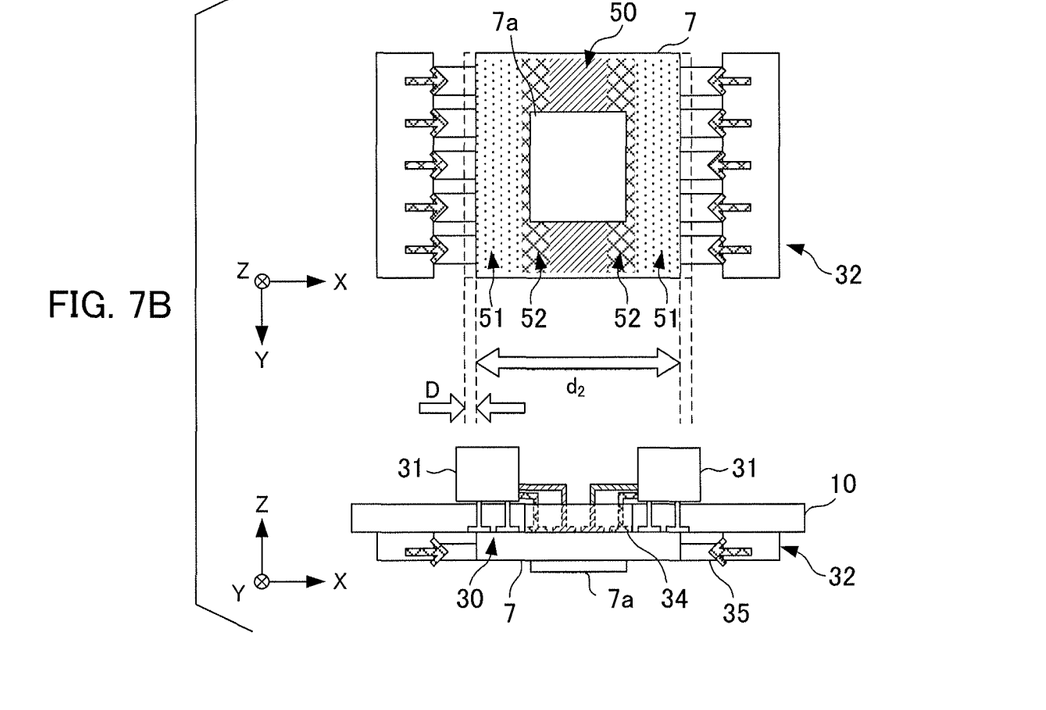

The position of the non-suction region 37 is not limited to the above position, and may be suitably set in response to the shape or number of aspiration ports 34. Furthermore, in the present embodiment, although the suction pressure of the non-suction region 37 is adjusted to atmospheric pressure, even when not adjusted up to atmospheric pressure, the pressure may be adjusted and set to be lower than the suction pressure on the suction region 38 (the suction force is weakened). In particular, when attempting to deform the pattern portion 7a in one axial direction in a planar orientation, the non-suction region is changed to coincide with the direction of application of force to thereby combine the non-suction region and the region in which the suction pressure is reduced. FIGS. 6A and 6B and FIGS. 7A and 7B are schematic diagrams illustrating the optimization by designating the suction region due to the suction unit 30 in the X axial direction, in response to the configuration during magnification correction of the mold 7 in the imprint apparatus 1 as illustrated in FIGS. 5A and 5B. First, as illustrated in FIG. 6A, in particular, when it is attempted to deform the pattern portion 7a in the X axial direction, the suction region 50 is extended in a configuration in which the pattern portion 7a is intersected in the other Y axial direction on the suction surface of the mold 7, and is set so that the width in the X axial direction is less than the width of the pattern portion 7a. In other words, the non-suction region 51, in this configuration, becomes the region other than the suction region 50 of the suction surface. In this manner, since the portion in the X axial direction of the suction region 50 is smaller than the portion in the Y axial direction, the magnification correcting mechanism 32 enables more efficient deformation of the mold 7 by application of an external force, in particular, in the X axial direction, as illustrated in FIG. 6B. Furthermore, in this configuration, as illustrated in FIGS. 7A and 7B, the region 52 that is positioned on both sides of the suction region 50 up to the side surface end of the pattern portion 7a may be set as a region with a lower suction pressure than the suction pressure of the suction region 50.

Next, the control unit 6 uses the wafer stage 4 to displace the wafer 9 until the substrate-side pattern region that is the object of pattern formation is positioned on the coating position of the coating unit 5, and during the coating step, the resin 13 is coated using the coating unit 5 (step S109). Thereafter, the control unit 6 displaces the wafer coated with resin 13 with the wafer stage 4 to the position for pressing onto the mold 7. Next, the control unit 6 operates the mold driving mechanism 11 in a mold pressing step to thereby press the resin 13 on the substrate-side pattern region and the pattern portion 7a of the mold 7 (step S110). Then, the control unit 6 cures the resin 13 by irradiation with UV light 8 with the light irradiation unit 2 in a curing step (step S111). Thereafter, the control unit 6 operates the mold driving mechanism 11 in a mold release step to thereby draw and to release the resin 13 cured on the substrate-side pattern region and the pattern portion 7a of the mold 7 (step S112).

The control unit 6 then determines whether or not a shot is present for formation of a pattern of resin 13 on the wafer 9 (step S113). When the control unit 6 determines that a shot is present for subsequent formation of a pattern (YES), the processing proceeds to step S106, and shape correction of the mold 7 is executed based on the correction amount for the next substrate-side pattern region that is already calculated in step S105. On the other hand, when the control unit 6 determines that a shot is not present for subsequent formation of a pattern (NO), the processing proceeds to step S114, and the wafer 9 that is imprint processed and mounted on the wafer chuck 14 is recovered using the substrate conveying mechanism (step S114). Next, the control unit 6 then determines whether or not there is another wafer to be subjected to the same imprint processing (step S115). When the control unit 6 determines whether or not there is another wafer to be subjected to imprint processing (YES), the processing proceeds to step S103, and the imprint processed wafer 9 is exchanged for the next wafer to be processed. On the other hand, the control unit 6 ends the operation sequence when it is determined that there is not another wafer to be processed (NO).

In the operation sequence illustrated in FIG. 4, the control unit 6 executes the sequence of changing the suction region from the step S106 to the step S108. However, the present invention is not limited in this regard, and, for example, the change in the suction region in step S108 may be executed after the curing step in step S111, and before or after the mold release step in step S112. Additionally, in the present embodiment, the suction portion using negative pressure has been described, but the method of generating the suction force is not limited to this method.

In the present embodiment, when deformation is executed by application of an external force to the mold 7 by the magnification correcting mechanism 32, since the suction region of the mold 7 is suitably changed, the mold 7 may be efficiently deformed. Furthermore, when deforming the mold 7, a change in the retention position of the mold 7 can be suppressed, in order to continue retention at a normal suction pressure in a single region for application of suction to a mold 7, for example, the region in proximity to the pattern portion 7a. Therefore, a global alignment configuration can be adopted in the imprint apparatus 1, when executing an alignment, to make the shape of the substrate-side pattern region on the wafer coincide with the shape of the pattern portion 7a, and is useful for improving throughput.

As described above, the present embodiment provides an imprint apparatus that is useful in relation to efficient alignment processing and mold shape correction.

(Manufacturing Method for an Article)

A method of manufacturing a device as an example of an article (e.g., a semiconductor integrated circuit element, a liquid crystal display element, or the like) includes a step of forming a pattern on a substrate (e.g., a wafer, a glass plate, or a film substrate), by use of the imprint apparatus described above. Furthermore, the manufacturing method includes a step of etching the substrate with the pattern formed thereon. When manufacturing another article, such as a patterned media (recording media), an optical element, or the like, the manufacturing method includes another process of processing the substrate with the pattern formed thereon in substitution for etching. In comparison to the conventional technique, the manufacturing method of an article according to the present embodiment finds application in relation to at least one of the performance characteristics, the quality, the production characteristics, and the production cost of the article.

While the embodiments of the present invention have been described with reference to exemplary embodiments, it is to be understood that the invention is not limited to the disclosed exemplary embodiments. The scope of the following claims is to be accorded the broadest interpretation so as to encompass all such modifications and equivalent structures and functions.

What is claimed is:

1. An imprint apparatus configured to form a pattern of an imprint material on a substrate with a mold, the imprint apparatus comprising:

a holding unit configured to hold the mold by attracting a first surface of the mold, the first surface being opposite to a second surface of the mold, the second surface on which the pattern is formed, with a suction unit that includes a plurality of suction force generating portions, wherein the first surface of the mold includes a first region and a second region, the second region being closer to a center of the mold from a lateral surface than is the first region;

a suction force adjusting unit configured to adjust a suction force applied by the plurality of suction force generating portions; and a shape correcting unit configured to apply a force to a lateral surface of the mold such that a shape of a pattern region of the mold gets closer to a shape of a substrate-side pattern region of the substrate, wherein, in the case of applying a force to the mold by use of the shape correcting unit, the suction force adjusting unit adjusts the suction force applied by the plurality of suction force generating portions, so that a suction force of the first region of the first surface of the mold is less that of the second region.

2. The imprint apparatus according to claim 1, wherein the first region is a region positioned more towards an end side of the mold than is the second region.

3. The imprint apparatus according to claim 1, wherein the suction force generating portion includes an aspiration port.

4. The imprint apparatus according to claim 3, wherein the suction force adjusting unit configures a suction pressure of the aspiration port in relation to the first region to atmospheric pressure.

5. The imprint apparatus according to claim 1, wherein, in the case when an amount of a force applied in one axial direction by the shape correcting unit is greater than the amount applied in another axial direction, a region that extends to intersect the pattern region in the other axial direction is configured as the second region.

6. The imprint apparatus according to claim 1, wherein the suction force adjusting unit increases the suction force in the first region prior to release of the mold and the resin on the substrate that are in contact.

7. The imprint apparatus according to claim 1, wherein the imprint material is a photocurable resin.

* * * * *